United States Patent
Hailey et al.

(10) Patent No.: US 7,379,308 B2
(45) Date of Patent: May 27, 2008

(54) SYSTEM AND METHOD FOR MANAGING INFORMATION HANDLING SYSTEM ELECTROMAGNETIC INTERFERENCE

(75) Inventors: Jeffrey C. Hailey, Austin, TX (US); Raymond A. McCormick, Round Rock, TX (US); Daniel E. Stivers, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 66 days.

(21) Appl. No.: 11/405,381

(22) Filed: Apr. 17, 2006

(65) Prior Publication Data

US 2007/0242443 A1 Oct. 18, 2007

(51) Int. Cl.
*H05K 9/00* (2006.01)

(52) U.S. Cl. .................. 361/818; 361/800; 361/816; 361/694; 361/695

(58) Field of Classification Search ............ 416/241 R; 361/694, 695, 800, 816, 818
See application file for complete search history.

(56) References Cited

U.S. PATENT DOCUMENTS

| | | | | |
|---|---|---|---|---|
| 3,887,877 A | * | 6/1975 | Vosteen | 330/10 |
| 3,953,783 A | * | 4/1976 | Peters, Jr. | 363/124 |
| 3,970,945 A | * | 7/1976 | Knapp | 329/308 |
| 3,990,063 A | * | 11/1976 | Schuman | 340/544 |
| 4,197,860 A | * | 4/1980 | Sterzer | 607/156 |
| 4,296,297 A | * | 10/1981 | Miller | 219/751 |
| 4,324,968 A | * | 4/1982 | Smith | 219/748 |
| 4,336,434 A | * | 6/1982 | Miller | 219/747 |
| 5,446,393 A | | 8/1995 | Schaefer | 324/754 |
| 6,710,546 B2 | | 3/2004 | Crenshaw | 315/86 |
| 2002/0059533 A1 | * | 5/2002 | Kaminski et al. | 713/300 |
| 2006/0012969 A1 | * | 1/2006 | Bachman | 361/816 |

OTHER PUBLICATIONS website: http://www.pccasegear.com/catagory_1.htm, archived Dec. 2, 2002 at http://web.archive.org/web/20021202065532/http://pccasegear.com/category57_1.htm.*
Intel processor website museum, http://www.intel.com museum.com/museum/online/hist_micro/hof/index.htm.*
Luo, X. and Chung, D. D. L.. ScienceDirect Article Mar. 29, 1999, titled: Electromagnetic interference Sheilding using continuous carbon-fibe carbon matrix and polymer-matrix composites.*
Kunkel, G., Shielding Theory and Practice, published Nov. 5, 1992 for the Regional symposium on EM compatability, Tel-Aviv, Israel.*

* cited by examiner

*Primary Examiner*—Dean A. Reichard
*Assistant Examiner*—Dameon E Levi
(74) *Attorney, Agent, or Firm*—Hamilton & Terrille, LLP; Robert W. Holland

(57) ABSTRACT

EMI from an operating information handling system is managed by disposing a stirring device in the chassis of the information handling system to mechanically modulate the resonance of predetermined RF signals emitted from processing components within the chassis. For example, a cooling fan disposed in the chassis has a reflective surface formed on its blades so that rotation of the blades mechanically modulates the RF signals. The blades have a depth of at least one-quarter of the wavelength of the RF signal and are coated with a low resistance material, such as steel, aluminum, copper, carbon loaded plastic or a high dielectric ceramic. The fan rotates at the faster of the speed required to provide desired cooling or the speed desired to produce a desired average RF signal amplitude.

18 Claims, 3 Drawing Sheets

SYSTEM AND METHOD FOR MANAGING INFORMATION HANDLING SYSTEM ELECTROMAGNETIC INTERFERENCE

BACKGROUND OF THE INVENTION

1. Field of the Invention

The present invention relates in general to the field of information handling system electromagnetic interference, and more particularly to a system and method for managing average emission of electromagnetic interference from an operating information handling system.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system manufacturers generally attempt to configure information handling systems to have as much processing power as is economically available for a chassis of a given volume. Many of the processing components included in a chassis produce radio frequency (RF) signals as a by product of their operation. The cumulative effect of these RF signals often creates electromagnetic interference (EMI) across a wide spectrum of frequencies. EMI is typically measured by the average amount of RF emissions from a chassis during operation of the processing components and is regulated by government bodies, such as the FCC in the United States and the CISPR in Europe. Typically, as information handling system volume decreases, manufacturers have to use greater care in the distribution of processing components within the chassis so that operational EMI constraints are met. One way to reduce average EMI emissions is to shield the processing components with a chassis that reflects RF energy. Shielding effectively reduces EMI, however, EMI still escapes through the shielding and from unshielded portions of the chassis. Further, excessive reliance on shielding increases the cost, size and weight of an information handling system. Excessive weight and size of an information handling system chassis is typically viewed as a detriment by end users.

Information handling system components have steadily increased their processing capability over the past several years, often by operating at higher clock speeds. For instance, higher-speed serialized interconnects have become more prevalent in information handling systems that emit RF signals of greater than 1 GHz. The concentration of such RF signals at specific frequencies is increased for some serialized interconnects that do not allow for spread-spectrum clocking, such as the Serial-Attached-SCSI (SAS) and Fiber-Channel interconnects. Regulatory agencies have responded by placing restrictions on EMI in higher frequencies that are difficult for information handling system manufacturers to achieve. Often, measured emissions are not sufficiently reduced by existing EMI shielding technologies.

SUMMARY OF THE INVENTION

Therefore a need has arisen for a system and method which reduces average EMI from an information handling system.

In accordance with the present invention, a system and method are provided which substantially reduce the disadvantages and problems associated with previous methods and systems for reducing average EMI from an information handling system. A stirring device mechanically modulates reflective surfaces within an information handling system chassis to reduce the average RF signals emitted from processing components operating within the chassis.

More specifically, an information handling system processes information with plural processing components disposed in a chassis. The processing components emit RF signals that are partially subdued by the chassis and partially pass outside the chassis. A cooling fan having plural blades rotates within the chassis to provide cooling airflow to the processing components. Reflective surfaces disposed on the cooling fan blades modulate the RF signals emitted from the processing components to reduce the average EMI emitted from the chassis over a predetermined time. The cooling fan operates at a minimum speed so that substantial numbers of rotations are made over the averaged EMI's measurement time. The fan blades are made of or coated with a variety of reflective materials, such as steel, copper, aluminum, carbon-loaded plastic or high dielectric ceramic.

The present invention provides a number of important technical advantages. One example of an important technical advantage is that average EMI from an information handling system is reduced with minimal modification to the information handling system. For example, placing a reflective surface on one or more cooling fan blades mechanically modulates the resonance of EMI to reduce average emissions for meeting regulatory constraints. The reflective surface on the fan blades adds little if any cost or weight to the system. Indeed, the lower average EMI at troublesome frequencies means information handling system weight and cost reductions since less shielding and engineering design work is required to meet regulatory constraints.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Mechanically modulating a reflective surface in an information handling system housing reduces average EMI emitted from the information handling system to better achieve regulatory standards that limit EMI. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
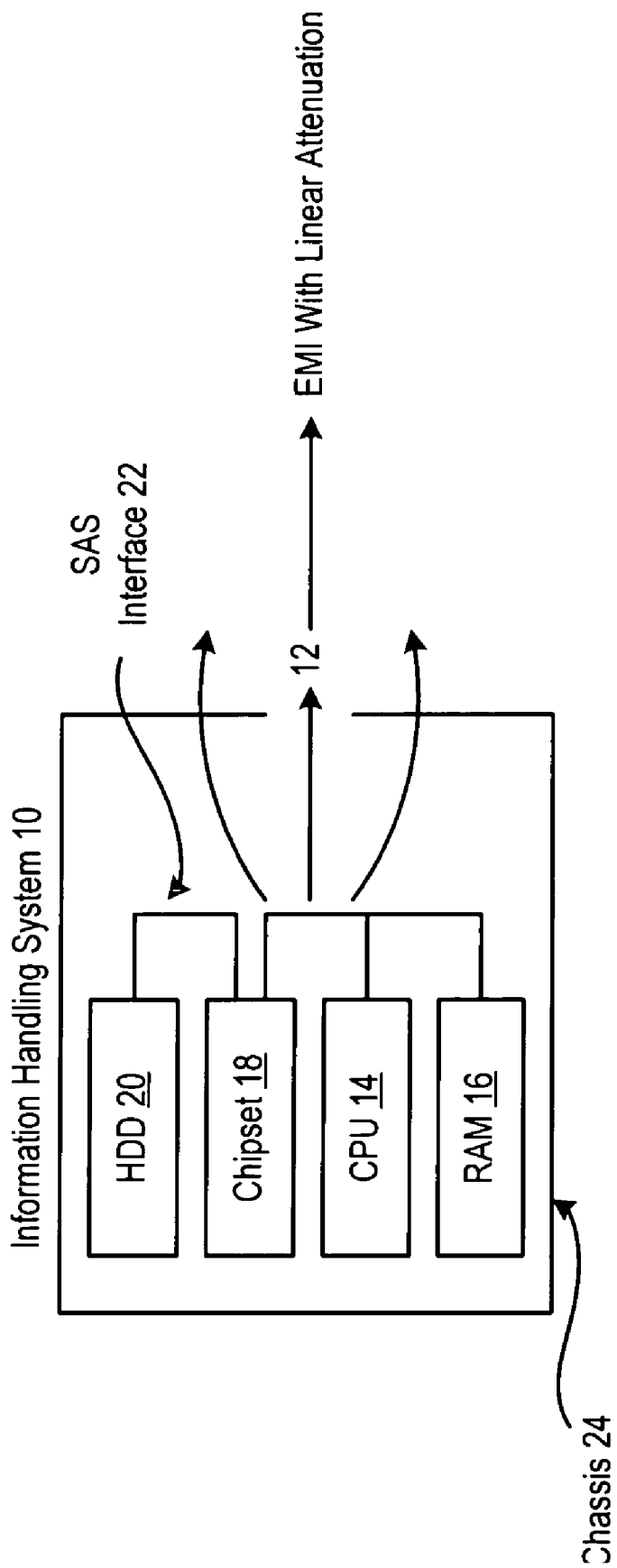
FIG. 1 depicts a block diagram of an information handling system emitting RF signals with linear attenuation.

Referring now to FIG. 1, a block diagram depicts an information handling system 10 emitting RF signals 12 with linear attenuation. Information handling system 10 has plural processing components that process information, such as a CPU 14, RAM 16, a chipset 18 and a hard disk drive 20. The processing components interface with each other through buses, such as SAS serialized interconnect 22. The electronic signals generated by the processing components and communicated across the buses generated RF signals that have frequency and amplitude characteristics based upon the operating characteristics of the processing components. For instance, SAS serialized interconnect 22 operates at high frequencies and, accordingly, generates high frequency RF signals of 1 GHz or greater. Other serialized interconnects, such as Fiber-Channel interconnects, produce similar high frequency RF signals that, like SAS serialized interconnect 22, are not moderated by spread-spectrum clocking. A chassis 24 that encases the processing components partially shields the emitted RF signals from passing beyond the chassis as EMI. The EMI that does pass beyond chassis 24 must fall within regulatory guidelines that define the amplitude of EMI allowed at various frequencies. For instance, the European standards committee, CISPR, recently introduced an updated emission standard, CISPR22, that makes emissions measurements 4 dB more restrictive than the current FCC standard in the range of 1-3 GHz measured as averaged emissions with an averaging bandwidth of 1 s.

Figure 2:
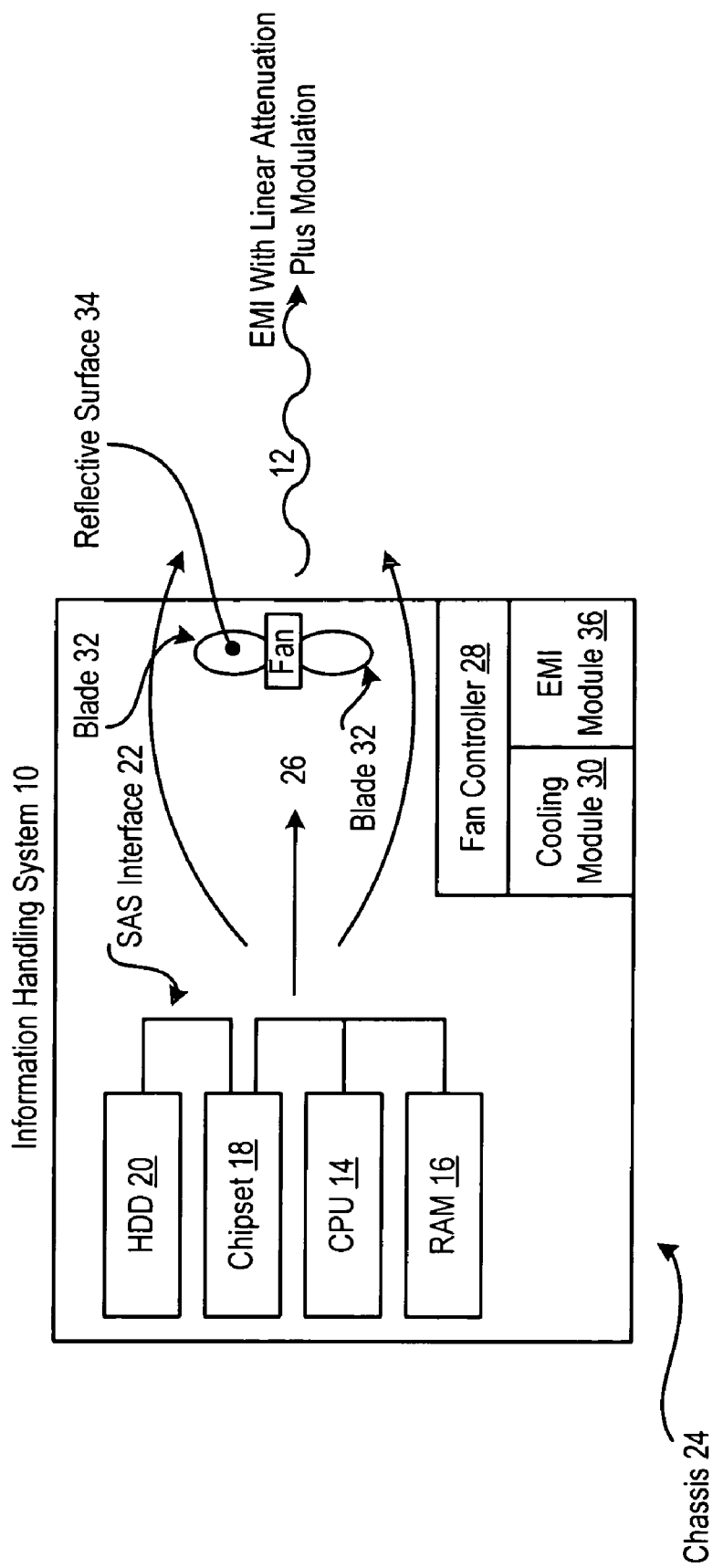
FIG. 2 depicts a block diagram of an information handling system emitting RF signals having linear attenuation with modulation provided by a stirring device.

Referring now to FIG. 2, a block diagram depicts an information handling system 10 emitting RF signals 12 having linear attenuation with modulation provided by a stirring device, depicted as cooling fan 26. Cooling fan 26 provides cooling airflow to cool the processing components under the management of a fan controller 28. A cooling module 30 tracks the temperature within chassis 24 and adjusts the rotation speed of cooling fan 26 to maintain a desired interior temperature. Cooling fan 26 rotates blades 32 that have a reflective surface 34. The movement of reflective surface 34 as cooling fan 26 rotates blades 32 results in the modulation of the RF signals from the processing components to reduce the average emissions. By stirring reflective surfaces 34 at a rate substantially higher than is averaging time, the averaging bandwidth used to determine the average RF signal emissions above 1 GHz, the average measurement is reduced by the mechanical modulation of the resonance associated with any emissions. Although a separate mechanically modulating stirring device may be included in chassis 24, use of cooling fan 26 saves space and power consumption. An EMI module 36 determines a minimum cooling fan speed to achieve desired EMI reduction and fan controller 28 operates fan 26 at the greater of the speed determined by EMI module 36 or cooling module 30.

Figure 4:
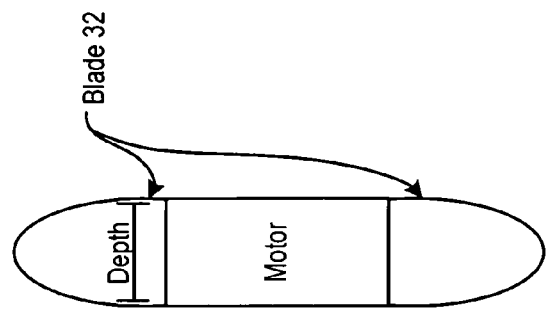
FIG. 4 depicts a side view of the cooling fan blades.
Figure 3:
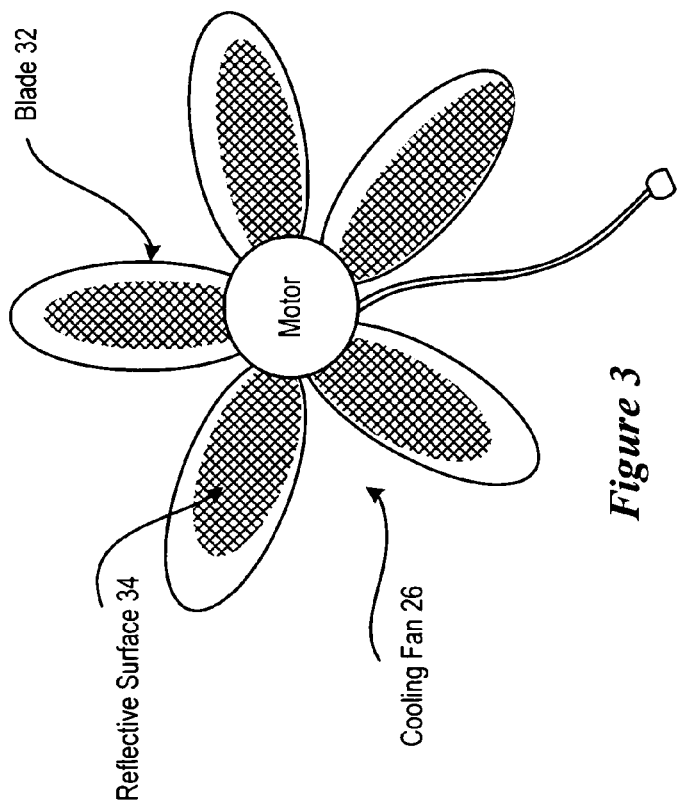
FIG. 3 depicts a cooling fan having blades configured with a reflective surface.

Referring now to FIG. 3, a cooling fan 26 is depicted having blades 32 configured with a reflective surface 34. For instance, the fan is molded from plastic and then the blades are coated with a reflective material, such as steel, copper, aluminum, or other highly-conductive metal. Alternatively, the fan is molded entirely from a reflective material like the metals or non-metallic conducting materials, such as carbon-loaded plastic or high-dielectric ceramic. The modulation of the reflective fan blades generates a saw tooth pattern with a modulation frequency related to the fan rotation speed. The reduction achieved by the averaged emissions is based on the wavelength of the frequency being measured, the depth of the fan blade (as is depicted by FIG. 4) and the modulation frequency, which is based on the fan speed and the number of fan blades. The fan depth is related to the wavelength of the RF signal being reduced. For instance, the fan depth should be at least one-quarter of the wavelength of the RF signal, a 10 cm distance for a 3 GHz wavelength. As an example, in an information handling system having an excited SAS controller card, emissions in the 1 to 3 GHz range were reduced by approximately 3 dB by applying metal tape to the blades of a fan. The peak readings between the modified and unmodified fan blades were substantially identical.

Although the present invention has been described in detail, it should be understood that various changes, substitutions and alterations can be made hereto without departing from the spirit and scope of the invention as defined by the appended claims.

What is claimed is:

1. An information handling system comprising:
   a chassis;
   plural processing components disposed in the chassis and operable to process information, the processing components generating one or more RF signals having one or more predetermined frequencies; and
   a stirring device disposed in the chassis, the stirring device having one or more reflective surfaces moving in a predetermined manner to modulate resonance of the RF signal to have an average emission amplitude below a predetermined amount;
   wherein the stirring device comprises a cooling fan having plural fan blades, the reflective surface comprising one or more of the fan blades, the fan blades rotating to provide cooling air to the processing components, the fan blades comprising plastic having a copper surface.

2. The information handling system of claim 1 wherein the processing components comprise a serialized interconnect having an RF signal of equal to or greater than one GHz.

3. An information handling system comprising:
   a chassis;
   plural processing components disposed in the chassis and operable to process information, the processing components generating one or more RF signals having one or more predetermined frequencies; and a stirring device disposed in the chassis, the stirring device having one or more reflective surfaces moving in a predetermined manner to modulate resonance of the RF signal to have an average emission amplitude below a predetermined amount;

wherein the stirring device comprises a cooling fan having plural fan blades, the reflective surface comprising one or more of the fan blades, the fan blades rotating to provide cooling air to the processing components, the fan blades comprising plastic having an aluminum surface.

4. An information handling system comprising:

a chassis;

plural processing components disposed in the chassis and operable to process information, the processing components generating one or more RF signals having one or more predetermined frequencies; and a stirring device disposed in the chassis, the stirring device having one or more reflective surfaces moving in a predetermined manner to modulate resonance of the RF signal to have an average emission amplitude below a predetermined amount;

wherein the stirring device comprises a cooling fan having plural fan blades, the reflective surface comprising one or more of the fan blades, the fan blades rotating to provide cooling air to the processing components, the fan blades comprising plastic having steel surface.

5. An information handling system comprising:

a chassis;

plural processing components disposed in the chassis and operable to process information, the processing components generating one or more RF signals having one or more predetermined frequencies; and a stirring device disposed in the chassis, the stirring device having one or more reflective surfaces moving in a predetermined manner to modulate resonance of the RF signal to have an average emission amplitude below a predetermined amount;

wherein the stirring device comprises a cooling fan having plural fan blades, the reflective surface comprising one or more of the blades, the blades rotating to provide cooling air to the processing components, the blades comprising carbon-loaded plastic.

6. An information handling system comprising:

a chassis;

plural processing components disposed in the chassis and operable to process information, the processing components generating one or more RF signals having one or more predetermined frequencies; and a stirring device disposed in the chassis, the stirring device having one or more reflective surfaces moving in a predetermined manner to modulate resonance of the RF signal to have an average emission amplitude below a predetermined amount;

wherein the stirring device comprises a cooling fan having plural fan blades, the reflective surface comprising one or more of the blades, the blades rotating to provide cooling air to the processing components, the blades comprising a high dielectric ceramic.

7. The information handling system of claim 1 wherein the RF signal has a wavelength and the fan blades have a depth, the depth at least one-quaffer of the wavelength.

8. An information handling system comprising:

a chassis;

plural processing components disposed in the chassis and operable to process information, the processing components generating one or more RF signals having one or more predetermined frequencies; and a stirring device disposed in the chassis, the stirring device having one or more reflective surfaces moving in a predetermined manner to modulate resonance of the RF signal to have an average emission amplitude below a predetermined amount;

wherein the stirring device comprises a cooling fan having plural blades, the reflective surface comprising one or more of the blades, the blades rotating to provide cooling air to the processing components, and wherein the fan blades rotate at a speed, the speed set at the higher of a desired cooling speed or a desired modulation frequency associated with the average emission amplitude below the predetermined amount.

9. A method for managing RF signal emissions from an information handling system chassis, the method comprising:

inserting a stirring device in the information handling system, the stirring device having a reflective surface; and mechanically modulating the stirring device reflective surface to reduce a predetermined RF signal amplitude emitted by processing components within the chassis to at least a predetermined average amplitude.

10. The method of claim 9 wherein the stirring device comprises a cooling fan having plural blades, the blades having the reflective surface.

11. The method of claim 10 wherein mechanically modulating the stirring device further comprises rotating the fan blades at the greater of a speed to provide desired cooling airflow or a speed to provide a desired reduction of the predetermined RF signal amplitude.

12. The method of claim 10 wherein the reflective surface comprises aluminum.

13. The method of claim 10 wherein the reflective surface comprises copper.

14. The method of claim 10 wherein the reflective surface comprises steel.

15. The method of claim 10 wherein the reflective surface comprises carbon loaded plastic.

16. The method of claim 10 wherein the reflective surface comprises high-dielectric ceramic.

17. The method of claim 10 wherein the processing components comprise a serialized interconnect emitting RF signals of one GHz or greater.

18. The method of claim 10 wherein the cooling fan blades have a depth of at least one-quarter of the RF signal's wavelength.

* * * * *